US012775769B2

(12) United States Patent
Lin et al.

(10) Patent No.: US 12,775,769 B2
(45) Date of Patent: Oct. 27, 2026

(54) INTEGRATED CIRCUIT DESIGN METHOD AND SYSTEM

(71) Applicant: TAIWAN SEMICONDUCTOR MANUFACTURING COMPANY, LTD., Hsinchu (TW)

(72) Inventors: Yu-Wen Lin, Hsinchu (TW); Bogdan Tutuianu, Hsinchu (TW); Florentin Dartu, Hsinchu (TW); Wei-Chih Hsieh, Hsinchu (TW); Osamu Takahashi, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 807 days.

(21) Appl. No.: 18/160,593

(22) Filed: Jan. 27, 2023

(65) Prior Publication Data

US 2024/0143880 A1 May 2, 2024

Related U.S. Application Data

(60) Provisional application No. 63/381,805, filed on Nov. 1, 2022.

(51) Int. Cl.
*G06F 30/3315* (2020.01)
*G06F 30/398* (2020.01)

(52) U.S. Cl.
CPC ........ *G06F 30/3315* (2020.01); *G06F 30/398* (2020.01)

(58) Field of Classification Search
CPC ............... G06F 30/3315; G06F 30/398; G06F 2119/12; G06F 30/3312; G06F 30/367; G06F 30/30; G06F 30/39
USPC ........................................................ 716/113
See application file for complete search history.

(56) References Cited

U.S. PATENT DOCUMENTS

| | | | | |
|---|---|---|---|---|
| 7,795,939 | B2 | 9/2010 | Chen et al. | |
| 7,802,209 | B2 | 9/2010 | Liu et al. | |
| 8,117,575 | B2 | 2/2012 | Lu et al. | |
| 8,365,115 | B2 | 1/2013 | Liu et al. | |
| 9,275,178 | B1 * | 3/2016 | Fung .................. | G06F 30/3312 |
| 11,055,460 | B1 | 7/2021 | Abdi et al. | |
| 11,176,305 | B2 | 11/2021 | Chen et al. | |
| 2011/0302460 | A1 * | 12/2011 | Idgunji .............. | G01R 31/3016 714/E11.024 |
| 2017/0262569 | A1 * | 9/2017 | Huynh ............... | G06F 30/3312 |

FOREIGN PATENT DOCUMENTS

| | | |
|---|---|---|
| CN | 102160054 | 8/2011 |
| CN | 105359149 | 2/2016 |
| CN | 114077818 | 2/2022 |

(Continued)

*Primary Examiner* — Paul Dinh
(74) *Attorney, Agent, or Firm* — Hauptman Ham, LLP

(57) ABSTRACT

A method includes determining a first timing of a transition sequence of a signal on a first path of an integrated circuit (IC) design, the first timing being based on an IC design signoff voltage, determining a second timing of the transition sequence of the signal on the first path, the second timing being based on the signoff voltage and a first voltage drop along the first path, calculating a first path derating factor based on a timing gap between the first and second timings of the transition sequence, and using the first path derating factor to evaluate the IC design.

20 Claims, 7 Drawing Sheets

(56) References Cited

FOREIGN PATENT DOCUMENTS

| | | |
|---|---|---|
| CN | 114966354 | 8/2022 |
| TW | 201602819 | 1/2016 |
| TW | 202226760 | 7/2022 |

* cited by examiner

400

INTEGRATED CIRCUIT DESIGN METHOD AND SYSTEM

PRIORITY CLAIM

The present application claims the benefit of U.S. Provisional Application No. 63/381,805, filed Nov. 1, 2022, which is incorporated herein by reference in its entirety.

BACKGROUND

The ongoing trend in miniaturizing integrated circuits (ICs) has resulted in progressively smaller devices which consume less power, yet provide more functionality at higher speeds than earlier technologies. Miniaturization has been achieved through design and manufacturing innovations tied to increasingly strict specifications. Various electronic design automation (EDA) tools are used to generate, revise, and verify designs for semiconductor devices while ensuring that design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
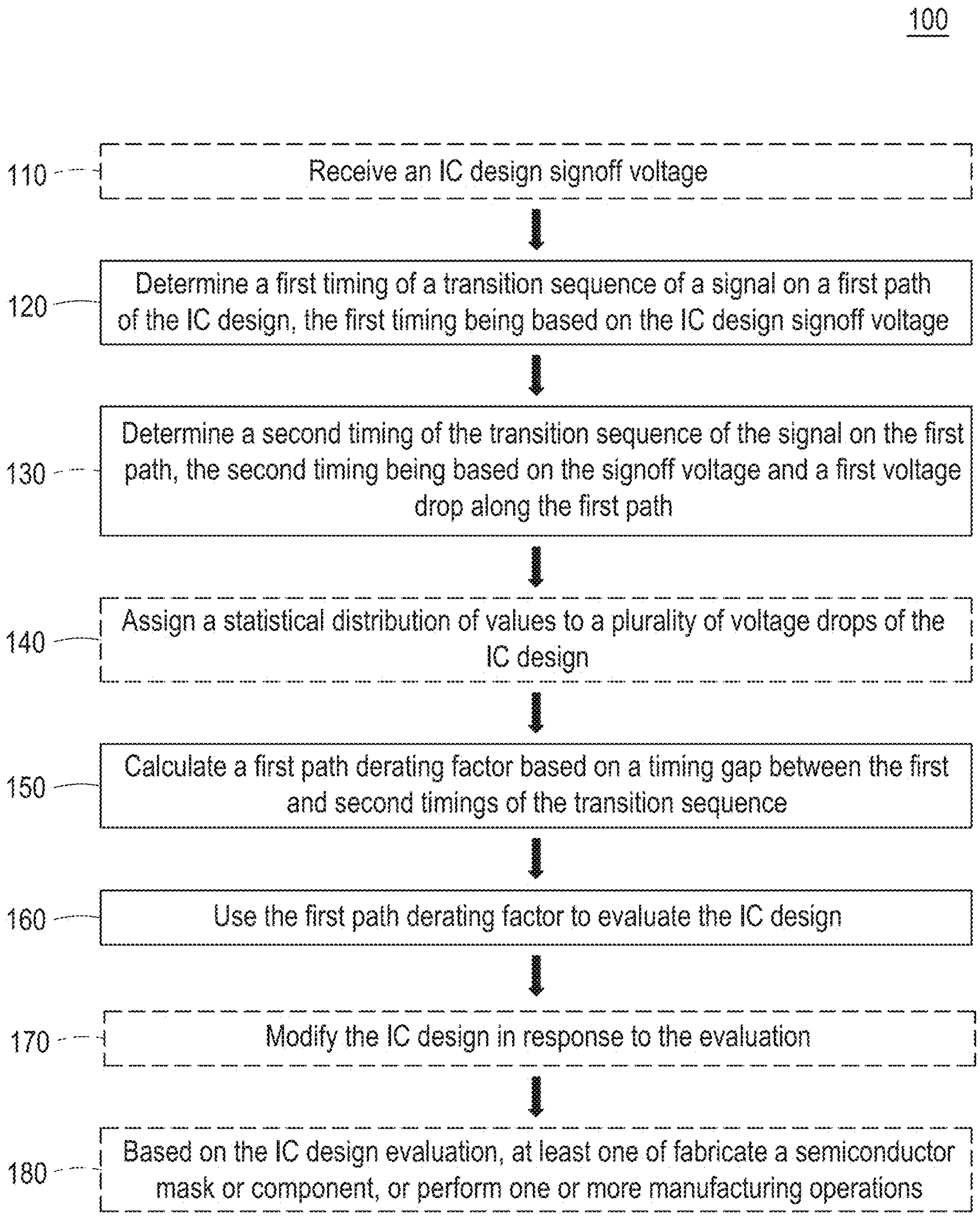
FIG. 1 is a flowchart of a method of performing an IC design process, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a system and method are directed to determining first and second timings of a transition sequence of a signal on a path of an IC design, the first timing being based on an IC design signoff voltage and the second timing being based on the signoff voltage and a voltage drop along the path. A path derating factor is calculated based on a timing gap between the first and second timings, and the path derating factor is used to evaluate the IC design. Compared to approaches based on signoff voltages without including potential local voltage drops due to on-chip variations (OCV) of a manufacturing process, the system and method are capable of identifying timing risks that might otherwise be missed.

In some embodiments, the system and method include assigning a statistical distribution of voltage drop values to each of multiple paths of the IC design, calculating pluralities of path derating factors based on the statistical distribution of values, and defining a path derating factor as an IC design signoff level. Compared to other approaches, such embodiments enable expanded timing risk detection and allow both risk identification and signoff level definition to be based on user specified criteria.

FIG. 1 is a flowchart of a method 100 of performing an IC design process, in accordance with some embodiments. In some embodiments, some or all of method 100 is executed by a processor of a computer. In some embodiments, executing some or all of method 100 is part of executing an automated place-and-route (APR) operation using a processor of a computer. In some embodiments, some or all of method 100 is executed by a processor 602 of an IC design system 600, discussed below with respect to FIG. 6.

Some or all of the operations of method 100 are capable of being performed as part of a design procedure performed in a design house, e.g., a design house 720 discussed below with respect to FIG. 7.

In some embodiments, the operations of method 100 are performed in the order depicted in FIG. 1. In some embodiments, the operations of method 100 are performed in an order other than the order depicted in FIG. 1. In some embodiments, one or more operations are performed before, between, during, and/or after performing one or more operations of method 100.

Figure 3A:
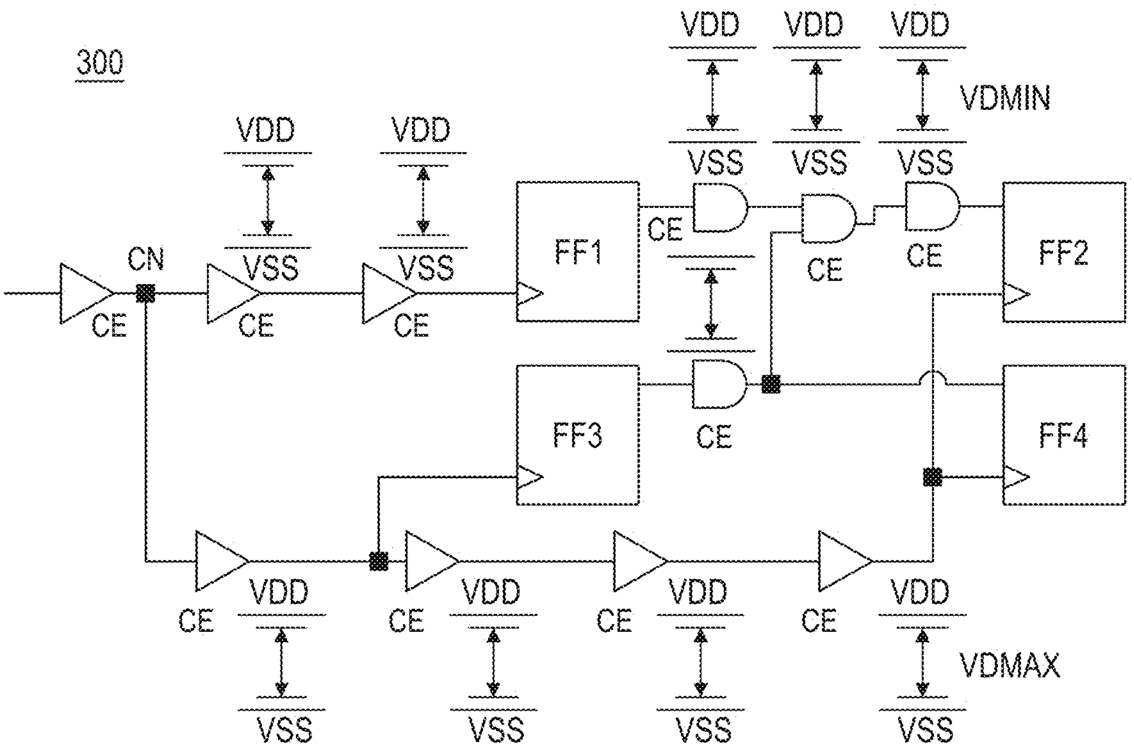
FIGS. 3A and 3B depict derating factor derivation operations, in accordance with some embodiments.
Figure 3B:
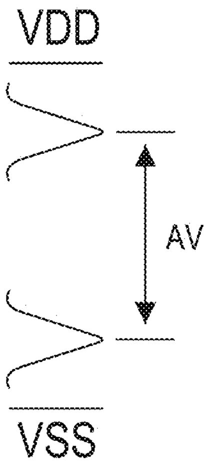
Figure 4:
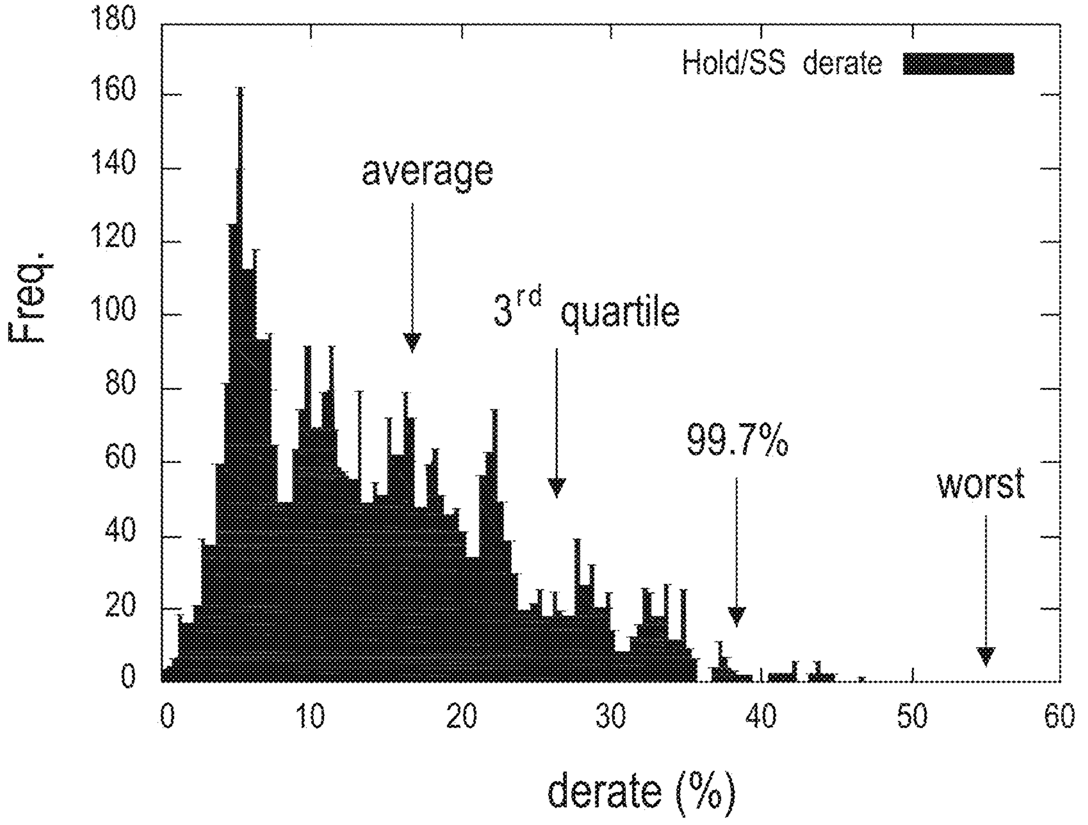
FIG. 4 depicts derating factor derivation operations, in accordance with some embodiments.
Figure 5:
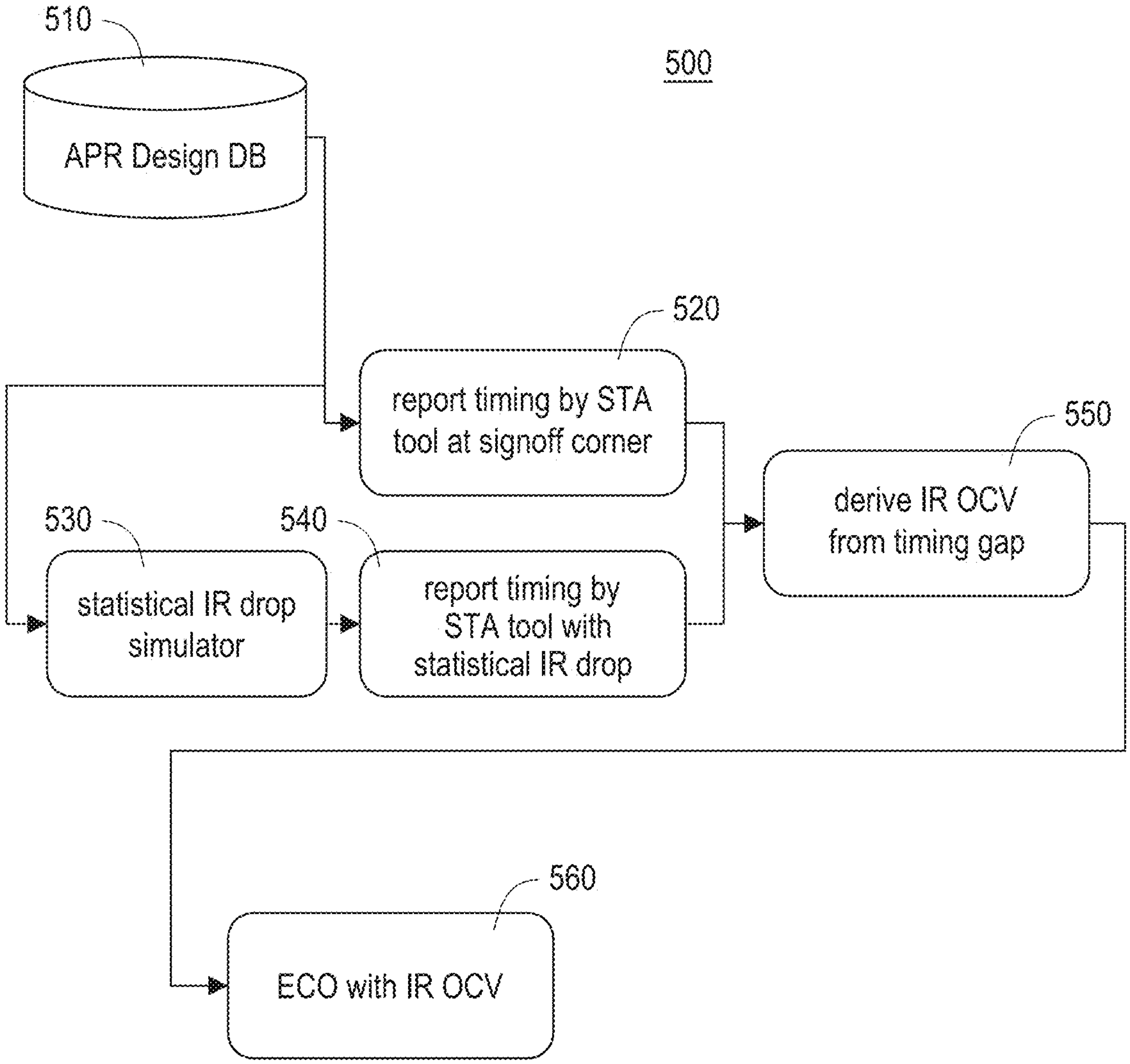
FIG. 5 depicts an IC design flow, in accordance with some embodiments.

Various operations of method 100 are illustrated using non-limiting examples depicted in FIGS. 2A-5. As further discussed below, FIGS. 2A-4 depict derating factor derivation operations, in accordance with some embodiments, and FIG. 5 depicts an IC design flow, in accordance with some embodiments.

At operation 110, in some embodiments, an IC design signoff voltage is received. The IC design signoff voltage is a single, lowest voltage level corresponding to slowest switching speeds of each of PMOS and NMOS transistors of the IC design, e.g., a lowest allowable level below a nominal voltage level. The nominal voltage level corresponds to a difference between a nominal power supply voltage level and a nominal reference voltage level. In some embodiments, the single slowest switching speeds are referred to as a slow corner and the IC design signoff voltage is referred to as a signoff corner voltage or slow corner voltage.

The IC design signoff voltage decreasing with respect to the nominal voltage level corresponds to increasing tolerance of the IC design to manufacturing process variations. In some embodiments, the IC design signoff voltage has value ranging from 85 percent (%) to 95% of the nominal power supply voltage level. In some embodiments, the IC design signoff voltage has value of 90% of the nominal voltage level.

The IC design corresponds to an IC manufacturing process and to one or more IC device designs manufactured accordingly. The one or more IC device designs include one or more net lists including multiple circuit nodes and paths configured in accordance with various circuit functions. The one or more IC device designs also include one or more IC layout diagrams corresponding to the one or more net lists and used as the basis for the various operations of the manufacturing process, as discussed below with respect to FIG. 7.

At operation 120, a first timing of a transition sequence of a signal on a first path of the IC design is determined, the first timing being based on the IC design signoff voltage. The first timing of the transition sequence of the signal is determined based on an entirety of the first path having the IC design signoff voltage.

The transition sequence includes multiple signal transitions corresponding to the first path. In some embodiments, the transition sequence corresponds to multiple transitions of an individual signal associated with the first path. In some embodiments, the transition sequence corresponds to transitions of two signals associated with the first path, e.g., corresponding to parallel path components.

Figure 2A:
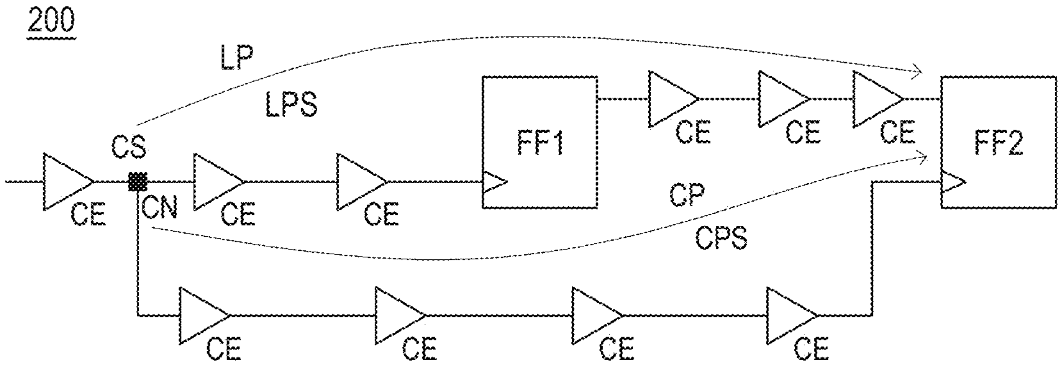
FIGS. 2A-2C depict derating factor derivation operations, in accordance with some embodiments.
Figure 2B:
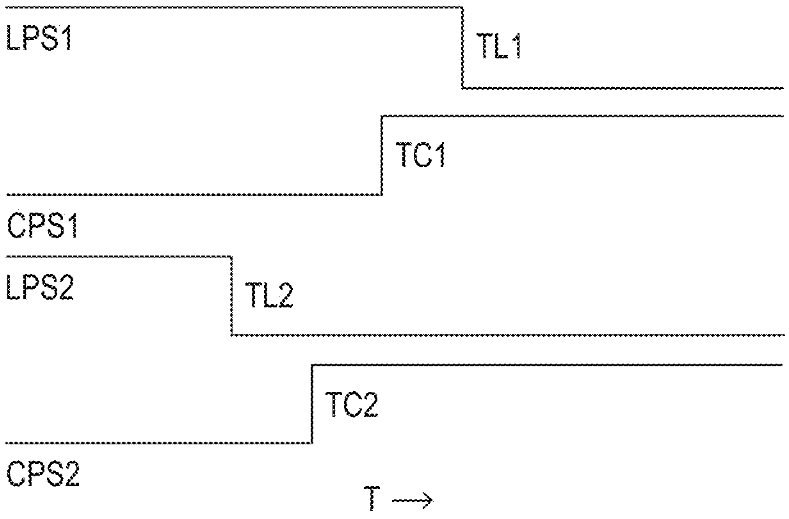
Figure 2C:
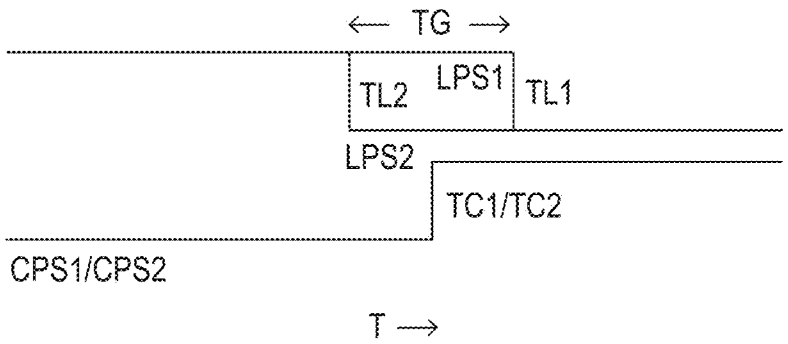

FIGS. 2A-2C depict derating factor derivation operations corresponding to a non-limiting example in which a path 200, depicted in FIG. 2A, includes a data launch path LP and a data capture path CP. Each of data launch path LP and data capture path CP extends from a node CN, also referred to as clock node ND in some embodiments, to a flip-flop FF2, and includes a series of instances of circuit elements CE. Data launch path LP also includes a flip-flop FF1 coupled along with the instances of circuit element CE between node CN and flip-flop FF2. Signal timing corresponding to path 200 is depicted in FIGS. 2B and 2C and based on circuit simulations, as further discussed below.

Circuit elements CE are types of IC components, e.g., corresponding to IC layout diagram cells, configured to propagate one or more signals through one or more transistors, e.g., a combinations of one or more PMOS transistor and one or more NMOS transistors, or other structures. In various embodiments, an instance of circuit element CE includes an inverter, a buffer, a delay element, a clock divider, a transmission gate, an OR, NOR, AND, NAND, or other logic gate, or other suitable IC component.

In various embodiments, instances of circuit element CE are same or different types of IC components. In the embodiment depicted in FIG. 2A, each instance of circuit element CE includes a single input terminal and a single output terminal. In some embodiments, a given instance of circuit element CE, e.g., coupled between flip-flops FF1 and FF2, includes more than one input terminal and/or more than one output terminal.

A flip-flop, e.g., flip-flop FF1 or FF2, also referred to as a data flip-flop in some embodiments, is an IC component configured to output a data signal based on a received data signal and having timing based on a received clock signal.

The numbers of instances of circuit elements CE and flip-flop FF1 depicted in FIG. 2A are non-limiting examples provided for the purpose of illustration. Other numbers of instances of circuit elements CE and/or flip-flop FF1 are within the scope of the present disclosure.

An output terminal of an instance of circuit element CE is coupled to node CN and thereby configured to output a clock signal CS on node CN. Data launch path LP is configured to propagate a data launch path signal LPS, based on clock signal CS, from node CN to a clock input terminal of flip-flop FF1. Flip-flop FF1 includes a data input terminal (not shown) configured to receive a data signal, and is configured to further propagate data launch path signal LPS, based in part on the data signal, from a data output terminal to a data input terminal of flip-flop FF2.

Data capture path CP is configured to propagate a data capture path signal CPS, based on clock signal CS, from node CN to a clock input terminal of flip-flop FF2.

The numbers of circuit elements CE and flip-flops FDF1 and FF2 depicted in FIG. 2A are non-limiting examples provided for the purpose of illustration. Other numbers of circuit elements CE and flip-flops FDF1 and FF2 are within the scope of the present disclosure.

FIG. 2B depicts instances LPS1 and LPS2 of data launch signal LPS and instances CPS1 and LPS2 of data capture signal CPS over time T. Instance LPS1 includes a transition from logic high to logic low at a time TL1, and instance CPS1 includes a transition from logic low to logic high at a time TC1.

Time TL1 corresponds to the time required for the transition in signal LPS to propagate from node CN to the data input terminal of flip-flop FF2, and time TC1 corresponds to the time required for the transition in signal CPS to propagate from node CN to the clock input terminal of flip-flop FF2. Each of times TL1 and TC1 corresponds to path 200 having the IC design signoff voltage along entireties of each of data launch path LP and data capture path CP.

The transitions in signals LPS and CPS thereby correspond to a transition sequence of signals LPS and CPS on path 200, and instances LPS1 and CPS1 thereby correspond to the first timing of the transition sequence.

FIGS. 2A-2C are further discussed below with respect to additional operations of method 100.

In some embodiments, the first path of the IC design is a first path of a plurality of paths of the IC design, and determining the first timing of the transition sequence of the signal on the first path of the IC design includes determining a corresponding first timing of a transition sequence of a signal on each path of the plurality of paths, each first timing being based on the IC design signoff voltage.

At operation 130, a second timing of the transition sequence of the signal on the first path is determined, the second timing being based on the signoff voltage and a first voltage drop along the first path. Because the signoff voltage is a lowest voltage level, a voltage drop, e.g., the first voltage drop, corresponds to a drop from a first voltage value greater than the signoff voltage to a second voltage value equal to or greater than the signoff voltage.

A given voltage drop corresponds to a resistance-based drop, i.e., an IR drop, along a corresponding signal propagation path such that the first voltage value is an early path voltage present at the path origin, and the second voltage value is a late path voltage present at the path terminus.

In various embodiments, one or both of the signoff voltage value or an instance of a voltage drop value corresponds to one or a combination of a maximum voltage value being less than the nominal power supply voltage level by a first given amount or a minimum voltage value being greater than the nominal reference voltage level by a second given amount.

In the embodiment depicted in FIGS. 2A-2C, the path origin and terminus correspond to node CN and flip-flop FF2, respectively. Each of signal instances LPS2 and CPS2 and times TL2 and TC2 corresponds to path 200 having the IC design signoff voltage at flip-flop FF2, and a voltage value greater than the IC design signoff voltage at node CN. Instances LPS1 and CPS1 thereby correspond to the second timing of the transition sequence discussed above with respect to operation 120.

Based on the node CN voltage value being greater than the IC design signoff voltage, signal instance LPS2 propagates faster than instance LPS1 such that time TL2 is less than time TL1, and signal instance CPS2 propagates faster than instance CPS1 such that time TC2 is less than time TC1.

Based on data launch path LP having a configuration different from that of data capture path CP, the difference between times TL1 and TL2 is not equal to the difference between times TC1 and TC2. Accordingly, a timing gap exists between the second timing of the transition sequence corresponding to instances LPS2 and CPS2 and the first timing of the transition sequence corresponding to instances LPS1 and CPS1, as further discussed below with respect to operation 150.

In various embodiments, a given voltage drop corresponds to a maximum voltage drop of the IC design or to a non-zero value less than the maximum voltage drop of the IC design. In some embodiments, a given voltage drop is one voltage drop of a plurality of voltage drops applied to the corresponding path, e.g., the first path.

In some embodiments in which the first path of the IC design is the first path of the plurality of paths of the IC design, determining the second timing of the transition sequence of the signal on the first path of the IC design includes determining one or more second timings of the corresponding transition sequence of the signal on each path of the plurality of paths, each second timing being based on the IC design signoff voltage and one or more voltage drops.

Determining a second timing including a voltage drop in addition to the IC design signoff voltage used to determine the first timing enables an assessment of OCV impact on performance for a given technology that is applicable to multiple IC designs, as discussed below.

At operation 140, in some embodiments, a statistical distribution of values is assigned to a plurality of voltage drops of the IC design. Assigning the statistical distribution of values includes assigning the values ranging from the IC design signoff voltage to a value equal to the IC signoff voltage plus the maximum voltage drop value.

In various embodiments, assigning the statistical distribution of values includes assigning the statistical distribution of values to a plurality of voltage drops corresponding to a given path and/or assigning the statistical distribution of values to a plurality of voltage drops corresponding to a plurality of paths.

In some embodiments, assigning the statistical distribution of values includes performing a Monte-Carlo simulation to generate the values assigned to the plurality of voltage drops.

In some embodiments, assigning the statistical distribution of values includes assigning the statistical distribution of values based on global IC design information, e.g., one or more cell features such as a transistor voltage threshold type, a cell size, a transistor size or type, a cell function, or other suitable feature.

In some embodiments, assigning the statistical distribution of values includes assigning the statistical distribution of values based on one or more user-defined activity factors, e.g., a cell activity percentage rate such as 5%.

In some embodiments, assigning the statistical distribution of values includes assigning the statistical distribution of values based on a user-defined probability profile, e.g., a uniform or exponential distribution.

In some embodiments, assigning the statistical distribution of values includes assigning the statistical distribution of values based on user input, e.g., received through a user interface 626 discussed below with respect to FIG. 6.

In various embodiments, assigning the statistical distribution of values includes assigning unequal values to components of a given path, e.g., a first value being assigned to a data lunch path of a signal path and a second value being assigned to a data capture path of the signal path.

In the embodiment depicted in FIGS. 3A and 3B, an IC design 300 includes a signal path (not labeled) including a data launch path and data capture path extending between node CN and flip-flop FF2, and a signal path (not labeled) including a data launch path and data capture path extending between node CN and flip-flop FF4, as discussed above with respect to FIG. 2A.

As depicted in FIG. 3B, a voltage drop corresponds to a difference between an actual voltage AV and a nominal voltage equal to a power supply voltage level VDD minus a reference voltage level VSS. The voltage drop has a statistical distribution of values corresponding to statistical variations of maximum levels of actual voltage AV below power supply voltage level VDD and statistical variations of minimum levels of actual voltage AV above reference voltage level VSS. A maximum voltage drop value corresponds to a minimum value of actual voltage AV, and a minimum voltage drop value corresponds to a maximum value of actual voltage AV.

In the embodiment depicted in FIG. 3A, the data launch path extending from node CN to flip-flop FF2 is assigned a minimum voltage drop VDMIN, and the corresponding data capture path is assigned a maximum voltage drop VDMAX.

The embodiment depicted in FIG. 3A is a non-limiting example provided for the purpose of illustration. Other voltage drop assignments, e.g., those other than maximums or minimums and/or having equal values, are within the scope of the present disclosure.

Assigning a statistical distribution of values to voltage drops enables a comprehensive set of potential timing risks to be evaluated, as further discussed below.

At operation 150, a first path derating factor based on a timing gap between the first and second timings of the transition sequence is calculated. In various embodiments, calculating the first path derating factor is based on the timing gap being between the first and second timings of an individual signal or between the first and second timings of a signal having two components, e.g., a data launch signal and a data capture signal.

In some embodiments, calculating the timing gap includes comparing a first difference between a data launch path transition and a data capture transition of the first timing of the transition sequence to a second difference between the data launch path transition and the data capture transition of the second timing of the transition sequence.

In some embodiments, calculating the path derating factor includes setting a product of the path derating factor and a time of the data launch path transition equal to a difference between the data launch path transition time and the timing gap.

In the embodiment depicted in FIGS. 2A-2C, a timing gap calculation example is depicted in FIG. 2C. Instances CPS1 and CPS2 of data capture path signal CPS are shifted such that the transition corresponding to times TC1 and TC2 are aligned. Instances LPS1 and LPS2 of data launch path signal LPS are correspondingly shifted such that the transition corresponding to times TL1 and TL2 define a timing gap TG equal to time TL1 minus time TL2.

A derating factor (1-OCV) of data launch path of path 200 is calculated by connecting timing gap TG to the derating factor using the following equation:

$$TL1\,(1-OCV)=TL1-TG. \tag{1}$$

Accordingly, $$OCV=TG/TL1=[(TL1-TC1)+(TC2-TL2)]/TL1. \tag{2}$$

Based on the value of OCV corresponding to the voltage drop used to determine the instances LPS2 and CPS2, the derating factor (1-OCV) is thereby calculated. Derating factor (1-OCV) is capable of being used in one or more timing analyses to adjust signal timing along data launch path LP of path 200.

The derating factor calculation based on timing gap TG depicted in FIGS. 2A-2C is a non-limiting example provided for the purpose of illustration. Other calculations in which a timing gap is similarly connected to the derating factor are within the scope of the present disclosure.

In some embodiments, calculating the first path derating factor includes calculating a plurality of derating factors including the first derating factor and based on one or more timing gaps corresponding to the statistical distribution of voltage drop values of the first path.

In some embodiments in which the first path of the IC design is the first path of the plurality of paths of the IC design, calculating the first path derating factor includes calculating one or more derating factors of each path of the plurality of paths, each derating factor being based on the corresponding one or more timing gaps.

At operation 160, the first path derating factor is used to evaluate the IC design. In some embodiments, using the first path derating factor to evaluate the IC design includes performing a timing analysis including the first path derating factor.

In some embodiments in which the first path derating factor is included in a plurality of derating factors, e.g. based on a statistical distribution of voltage drop values, using the first path derating factor to evaluate the IC design includes using some or all of the derating factors to evaluate the IC design, e.g., by performing a timing analysis.

In some embodiments in which the first path derating factor is included in a plurality of derating factors, using the first path derating factor to evaluate the IC design includes generating a derating factor histogram, e.g., based on a Monte-Carlo simulation. In some embodiments generating the derating factor histogram includes displaying the histogram to a user, e.g., through user interface 626 discussed below with respect to FIG. 6.

In some embodiments, in which the first path derating factor is included in a plurality of derating factors, using the first path derating factor to evaluate the IC design includes automatically selecting or receiving a user selection of an IC design signoff level of the derating factors, e.g., corresponding to an average derating factor or a greatest derating factor.

FIG. 4 depicts derating factor derivation operations, in accordance with some embodiments. FIG. 4 includes a histogram 400 of derating factors calculated based on timing gaps corresponding to voltage drop values assigned by a Monte-Carlo simulation. The derating factors correspond to path 200 depicted in FIG. 2 in which timing of data hold activity is impacted by voltage drops along data launch path LP and data capture path CP.

In the embodiment depicted in FIG. 4, histogram 400 includes indications of derating factors corresponding to an average, a 3rd quartile, a 99% level, and a worst derating factor. A timing analysis based on a selection of the worst derating factor as the IC design signoff level thereby covers all potential timing risks based on the statistical distribution of voltage drops. A timing analysis based on a selection of the average or other derating factor as the IC design signoff level thereby covers a corresponding portion of the potential timing risks based on the statistical distribution of voltage drops.

The histogram depicted in FIG. 4 is a non-limiting example provided for the purpose of illustration. Other histogram types and IC design signoff levels are within the scope of the present disclosure.

At operation 170, in some embodiments, the IC design is modified in response to the evaluation. In various embodiments, modifying the IC design includes modifying one or both of a netlist or an IC layout diagram of the IC design.

In some embodiments, modifying the IC design includes storing the netlist or IC layout diagram in a storage device. In various embodiments, storing the netlist or IC layout diagram in the storage device includes storing the netlist or IC layout diagram in a non-volatile, computer-readable memory or a cell library, e.g., a database, and/or includes storing the netlist or IC layout diagram over a network. In some embodiments, storing the netlist or IC layout diagram in the storage device includes using IC design system 600, discussed below with respect to FIG. 6.

FIG. 5 depicts an IC design flow 500, in accordance with some embodiments. Design flow 500 includes an IC design database 510, timing reports 520 and 540, a statistical voltage drop simulation 530, an OCV calculation 550, and an engineering change order (ECO) 560.

IC design database 510 corresponds to an APR system in which signal connections are automatically routed in one or more IC layout diagram based on circuit paths specified in one or more netlists.

Timing report 520 corresponds to some or all of operation 120 in which the first timing is determined. Statistical voltage drop simulation 530 corresponds to some or all of operation 150 in which the statistical distribution of values is assigned to the voltage drops. Timing report 540 corresponds to some or all of operation 130 in which the first timing is determined based on the statistical distribution of values. OCV calculation 550 corresponds to some or all of operation 140 in which the first path derating factor is calculated based on the timing gap.

ECO 560 corresponds to some or all of operations 160 and 170 in which the first path derating factor is used to evaluate the IC design, and the IC design is modified based on the evaluation.

IC design flow 500 depicted in FIG. 5 is a non-limiting example provided for the purpose of illustration. Other design flows consistent with some or all of the operations of method 100 are within the scope of the present disclosure.

At operation 180, in some embodiments, at least one of one or more semiconductor masks or at least one component in a layer of a semiconductor IC is fabricated, or one or more manufacturing operations are performed based on the modified IC design. Fabricating one or more semiconductor masks or at least one component in a layer of a semiconductor IC, and performing one or more manufacturing operations, e.g., one or more lithographic exposures, based on a corresponding IC layout diagram are discussed below with respect to FIG. 7.

In some embodiments, performing one or more manufacturing operations includes performing one or more IC device design operations. In some embodiments, performing the one or more IC device design operations includes routing one or more metal lines to one or more components of the IC design.

By executing some or all of the operations of method 100, first and second timings of a transition sequence of a signal on a path of an IC design are determined, the first timing being based on an IC design signoff voltage and the second timing being based on the signoff voltage and a voltage drop along the path. A path derating factor is calculated based on a timing gap between the first and second timings, and the path derating factor is used to evaluate the IC design. Compared to approaches based on signoff voltages without including potential local voltage drops due to manufacturing process OCV, the method is capable of identifying timing risks that might otherwise be missed.

In some embodiments, executing some or all of the operations of method 100 includes assigning a statistical distribution of voltage drop values to each of multiple paths of the IC design, calculating pluralities of path derating factors based on the statistical distribution of values, and defining a path derating factor as an IC design signoff level. Compared to other approaches, such embodiments enable expanded timing risk detection and allow both risk identification and signoff level definition to be based on user specified criteria.

Figure 6:
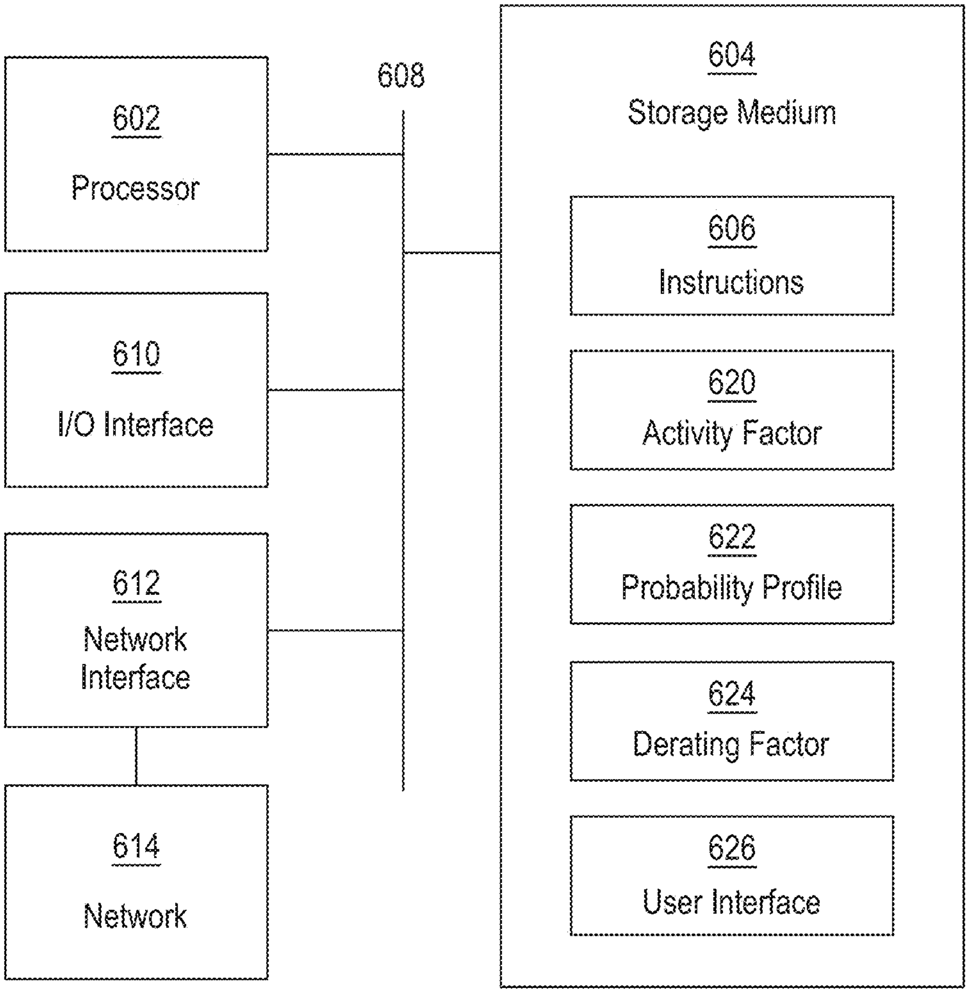
FIG. 6 is a block diagram of an IC design system, in accordance with some embodiments.

FIG. 6 is a block diagram of IC design system 600, in accordance with some embodiments. One or more operations of method 100, discussed above with respect to FIGS. 1-5, are implementable using IC design system 600, in accordance with some embodiments. In some embodiments, IC design system 600 is an EDA system.

In some embodiments, IC design system 600 is a computing device including a processor 602 and a non-transitory computer-readable storage medium 604. Non-transitory computer-readable storage medium 604, amongst other things, is encoded with, i.e., stores, computer program code 606, i.e., a set of executable instructions. Execution of instructions 606 by processor 602 represents (at least in part) an IC device design system which implements a portion or all of, e.g., a method 100 discussed above with respect to FIG. 1 (hereinafter, the noted processes and/or methods).

Processor 602 is electrically coupled to non-transitory computer-readable storage medium 604 via a bus 608. Processor 602 is also electrically coupled to an I/O interface 610 by bus 608. A network interface 612 is also electrically connected to processor 602 via bus 608. Network interface 612 is connected to a network 614, so that processor 602 and non-transitory, computer-readable storage medium 604 are capable of connecting to external elements via network 614. Processor 602 is configured to execute computer program code 606 encoded in non-transitory computer-readable storage medium 604 in order to cause IC design system 600 to be usable for performing a portion or all of the noted processes and/or methods. In one or more embodiments, processor 602 is a central processing unit (CPU), a multi-processor, a distributed processing system, an application specific integrated circuit (ASIC), and/or a suitable processing unit.

In one or more embodiments, non-transitory computer-readable storage medium 604 is an electronic, magnetic, optical, electromagnetic, infrared, and/or a semiconductor system (or apparatus or device). For example, non-transitory computer-readable storage medium 604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, non-transitory computer-readable storage medium 604 includes a compact disk-read only memory (CD-ROM), a compact disk-read/write (CD-R/W), and/or a digital video disc (DVD).

In one or more embodiments, non-transitory computer-readable storage medium 604 stores computer program code 606 configured to cause IC design system 600 to be usable for performing a portion or all of the noted processes and/or methods. In one or more embodiments, non-transitory computer-readable storage medium 604 also stores information which facilitates performing a portion or all of the noted processes and/or methods. In various embodiments, non-transitory computer-readable storage medium 604 stores one or a combination of at least one activity factor 620, probability profile 622, IC design signoff or other derating factor 624, or other design criteria (not labeled) as discussed above with respect to method 100 and FIGS. 1-5.

IC design system 600 includes I/O interface 610. I/O interface 610 is coupled to external circuitry. In various embodiments, I/O interface 610 includes one or a combination of a keyboard, keypad, mouse, trackball, trackpad, display, touchscreen, and/or cursor direction keys for communicating information and commands to and/or from processor 602.

IC design system 600 also includes network interface 612 coupled to processor 602. Network interface 612 allows IC design system 600 to communicate with network 614, to which one or more other computer systems are connected. Network interface 612 includes wireless network interfaces such as BLUETOOTH, WIFI, WIMAX, GPRS, or WCDMA; or wired network interfaces such as ETHERNET, USB, or IEEE-1364. In one or more embodiments, a portion or all of the noted processes and/or methods, is implemented in two or more IC design systems 600.

IC design system 600 is configured to receive information through I/O interface 610. The information received through I/O interface 610 includes one or a combination of at least one resistance value, at least one netlist, at least one IC layout diagram, at least one design rule, and/or other parameters for processing by processor 602. The information is transferred to processor 602 via bus 608. IC design system 600 is configured to transmit and/or receive information related to user interface 626 through I/O interface 610.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, an IC layout diagram is generated using a tool such as VIRTUOSO® available from CADENCE DESIGN SYSTEMS, Inc., or another suitable layout generating tool.

In some embodiments, the processes are realized as functions of a program stored in a non-transitory computer-readable recording medium. Examples of a non-transitory computer-readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

By being usable to implement one or more operations of method 100, as discussed above with respect to FIGS. 1-5, IC design system 600 including non-transitory computer-readable storage medium 604 enables the benefits discussed above with respect to method 100.

Figure 7:
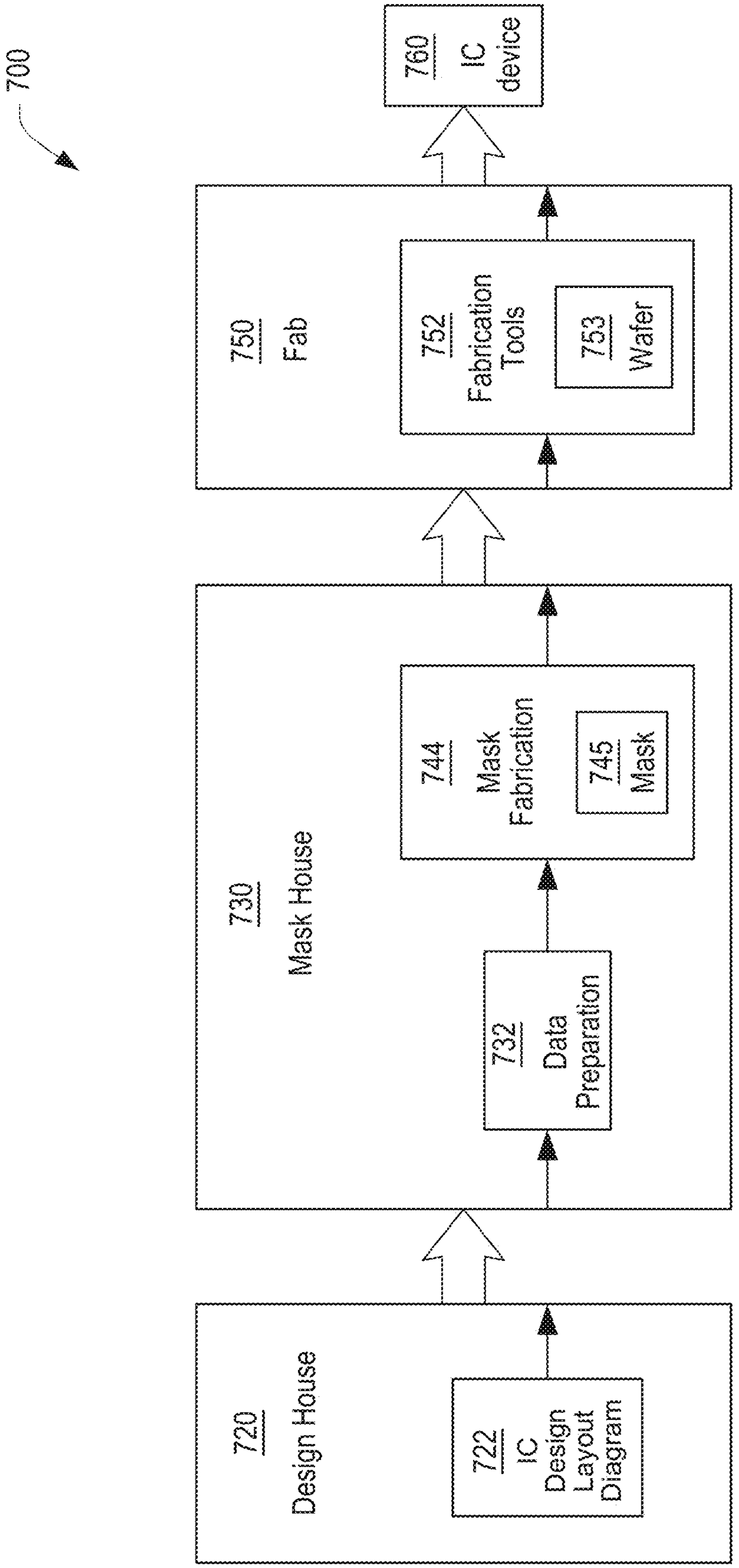
FIG. 7 is a block diagram of an integrated circuit (IC) manufacturing system, and an IC manufacturing flow associated therewith, in accordance with some embodiments.

FIG. 7 is a block diagram of IC manufacturing system 700, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 700.

In FIG. 7, IC manufacturing system 700 includes entities, such as a design house 720, a mask house 730, and an IC manufacturer/fabricator ("fab") 750, that interact with one another in the design, development, and manufacturing cycles and/or services related to manufacturing an IC device 760. The entities in system 700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 720, mask house 730, and IC fab 750 is owned by a single larger company. In some embodiments, two or more of design house 720, mask house 730, and IC fab 750 coexist in a common facility and use common resources.

Design house (or design team) 720 generates an IC design layout diagram 722 based on method 100, discussed above with respect to FIGS. 1-6. IC design layout diagram 722 includes various geometrical patterns that correspond to patterns of metal, oxide, or semiconductor layers that make up the various components of IC device 760 to be fabricated. The various layers combine to form various IC features. For example, a portion of IC design layout diagram 722 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 720 implements a proper design procedure including method 100, discussed above with respect to FIGS. 1-6, to form IC design layout diagram 722. The design procedure includes one or more of logic design, physical design or place and route. IC design layout diagram 722 is presented in one or more data files having information of the geometrical patterns. For example, IC design layout diagram 722 can be expressed in a GDSII file format or DFII file format.

Mask house 730 includes data preparation 732 and mask fabrication 744. Mask house 730 uses IC design layout diagram 722 to manufacture one or more masks 745 to be used for fabricating the various layers of IC device 760 according to IC design layout diagram 722. Mask house 730 performs mask data preparation 732, where IC design layout diagram 722 is translated into a representative data file ("RDF"). Mask data preparation 732 provides the RDF to mask fabrication 744. Mask fabrication 744 includes a mask writer. A mask writer converts the RDF to an image on a substrate, such as a mask (reticle) 745 or a semiconductor wafer 753. The design layout diagram 722 is manipulated by mask data preparation 732 to comply with particular characteristics of the mask writer and/or requirements of IC fab 750. In FIG. 7, mask data preparation 732 and mask fabrication 744 are illustrated as separate elements. In some embodiments, mask data preparation 732 and mask fabrication 744 can be collectively referred to as mask data preparation.

In some embodiments, mask data preparation 732 includes optical proximity correction (OPC) which uses lithography enhancement techniques to compensate for image errors, such as those that can arise from diffraction, interference, other process effects and the like. OPC adjusts IC design layout diagram 722. In some embodiments, mask data preparation 732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 732 includes a mask rule checker (MRC) that checks the IC design layout diagram 722 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 722 to compensate for limitations during mask fabrication 744, which may undo part of the modifications performed by OPC in order to meet mask creation rules.

In some embodiments, mask data preparation 732 includes lithography process checking (LPC) that simulates processing that will be implemented by IC fab 750 to fabricate IC device 760. LPC simulates this processing based on IC design layout diagram 722 to create a simulated manufactured device, such as IC device 760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 722.

It should be understood that the above description of mask data preparation 732 has been simplified for the purposes of clarity. In some embodiments, data preparation 732 includes additional features such as a logic operation (LOP) to modify the IC design layout diagram 722 according to manufacturing rules. Additionally, the processes applied to IC design layout diagram 722 during data preparation 732 may be executed in a variety of different orders.

After mask data preparation 732 and during mask fabrication 744, a mask 745 or a group of masks 745 are fabricated based on the modified IC design layout diagram 722. In some embodiments, mask fabrication 744 includes performing one or more lithographic exposures based on IC design layout diagram 722. In some embodiments, an electron-beam (e-beam) or a mechanism of multiple e-beams is used to form a pattern on a mask (photomask or reticle) 745 based on the modified IC design layout diagram 722. Mask 745 can be formed in various technologies. In some embodiments, mask 745 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 745 includes a transparent substrate (e.g., fused quartz) and an opaque material (e.g., chromium) coated in the opaque regions of the binary mask. In another example, mask 745 is formed using a phase shift technology. In a phase shift mask (PSM) version of mask 745, various features in the pattern formed on the phase shift mask are configured to have proper phase difference to enhance the resolution and imaging quality. In various examples, the phase shift mask can be attenuated PSM or alternating PSM. The mask(s) generated by mask fabrication 744 is used in a variety of processes. For example, such a mask(s) is used in an ion implantation process to form various doped regions in semiconductor wafer 753, in an etching process to form various etching regions in semiconductor wafer 753, and/or in other suitable processes.

IC fab 750 is an IC fabrication business that includes one or more manufacturing facilities for the fabrication of a variety of different IC products. In some embodiments, IC Fab 750 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 750 includes wafer fabrication tools 752 configured to execute various manufacturing operations on semiconductor wafer 753 such that IC device 760 is fabricated in accordance with the mask(s), e.g., mask 745. In various embodiments, fabrication tools 752 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein IC fab 750 uses mask(s) 745 fabricated by mask house 730 to fabricate IC device 760. Thus, IC fab 750 at least indirectly uses IC design layout diagram 722 to fabricate IC device 760. In some embodiments, semiconductor wafer 753 is fabricated by IC fab 750 using mask(s) 745 to form IC device 760. In some embodiments, the IC fabrication includes performing one or more lithographic exposures based at least indirectly on IC design layout diagram 722. Semiconductor wafer 753 includes a silicon substrate or other proper substrate having material layers formed thereon. Semiconductor wafer 753 further includes one or more of various doped regions, dielectric features, multilevel interconnects, and the like (formed at subsequent manufacturing steps).

In some embodiments, a method includes determining a first timing of a transition sequence of a signal on a first path of an IC design, the first timing being based on an IC design signoff voltage, determining a second timing of the transition sequence of the signal on the first path, the second timing being based on the signoff voltage and a first voltage drop along the first path, calculating a first path derating factor based on a timing gap between the first and second timings of the transition sequence, and using the first path derating factor to evaluate the IC design.

In some embodiments, a method includes determining, for each path of a plurality of paths of an IC design, first and second timings of a transition sequence of a path signal, the first timing being based on an IC design signoff voltage, and the second timing being based on the signoff voltage and a voltage drop along the path, assigning a statistical distribution of voltage drop values to each path of the plurality of paths, for each combination of a path of the plurality of paths and a voltage drop value of the statistical distribution of voltage drop values, calculating a path derating factor based on a timing gap between the first and second timings of the corresponding transition sequence, thereby generating a plurality of path derating factors of the IC design, and defining a path derating factor of the plurality of path derating factors as an IC design signoff level.

In some embodiments, an IC design system includes a processor and a non-transitory, computer readable storage medium including computer program code for one or more programs. The non-transitory, computer readable storage medium and the computer program code are configured to, with the processor, cause the processor to determine a first timing of a transition sequence of a signal on a path of an IC design, the first timing being based on an IC design signoff voltage, determine a second timing of the transition sequence of the signal on the path, the second timing being based on the signoff voltage and a first voltage drop along the path, calculate a path derating factor based on a timing gap between the first and second timings of the transition sequence, and perform a timing analysis on the IC design based on the path derating factor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

determining a first timing of a transition sequence of a signal on a first path of an integrated circuit (IC) design, the first timing being based on an IC design signoff voltage;

determining a second timing of the transition sequence of the signal on the first path, the second timing being based on the IC design signoff voltage and a first voltage drop of a plurality of voltage drops along the first path, the second timing of the transition sequence is one second timing of a plurality of second timings of the transition sequence corresponding to the plurality of voltage drops;

calculating a plurality of first path derating factors based on corresponding timing gaps between second timings of the plurality of second timings and the first timing of the transition sequence; and using the plurality of first path derating factors to evaluate the IC design.

2. The method of claim 1, wherein the first path comprises a data launch path and a data capture path, the transition sequence comprises a data launch path transition time and a data capture path transition time, the data launch path transition time minus the data capture path transition time of the first timing has a first magnitude and polarity, the data launch path transition time minus the data capture path transition time of the second timing of the plurality of second timings has a second magnitude and polarity, and the timing gaps have values equal to differences between the first magnitude and polarity and respective second magnitudes and polarity.

3. The method of claim 2, wherein the calculating the plurality of first path derating factors comprises setting products of the plurality of first path derating factors and the data launch path transition time equal to respective differences between the data launch path transition time and the corresponding timing gaps.

4. The method of claim 1, wherein the first path is a first path of a plurality of paths of the IC design, the plurality of voltage drops along the first path is included in a plurality of voltage drops of the IC design, and the method further comprises assigning a statistical distribution of values to the plurality of voltage drops of the IC design.

5. The method of claim 4, wherein the plurality of first path derating factors is included in a set of pluralities of path derating factors of the IC design, each plurality of path derating factors of the set corresponding to a path of the plurality of paths of the IC design, and the using the plurality of first path derating factors to evaluate the IC design comprises:

calculating the pluralities of path derating factors based on the statistical distribution of values of the plurality of voltage drops of the IC design; and defining a path derating factor of the pluralities of path derating factors as an IC design signoff value.

6. The method of claim 4, wherein the assigning the statistical distribution of values to the plurality of voltage drops of the IC design comprises one or more of basing one or more voltage drop values on a cell feature, applying user-defined activity factors to the statistical distribution, or applying a user-defined probability profile to the statistical distribution.

7. The method of claim 4, wherein the assigning the statistical distribution of values to the plurality of voltage drops of the IC design comprises using a Monte-Carlo simulation to generate a derating factor histogram, and the using the plurality of first path derating factors to evaluate the IC design comprises:

selecting a derating factor of the derating factor histogram as an IC design signoff level; and using the IC design signoff level to evaluate the IC design.

8. The method of claim 1, wherein the IC design signoff voltage comprises a slow corner voltage.

9. A method comprising:

determining, for each path of a plurality of paths of an integrated circuit (IC) design, first and second timings of a transition sequence of a path signal, the first timing being based on an IC design signoff voltage, and the second timing being based on the IC design signoff voltage and a voltage drop along the path;

assigning a statistical distribution of voltage drop values to each path of the plurality of paths;

for each combination of a path of the plurality of paths and a voltage drop value of the statistical distribution of voltage drop values, calculating a path derating factor based on a timing gap between the first and second timings of the corresponding transition sequence, thereby generating a plurality of path derating factors of the IC design; and defining a path derating factor of the plurality of path derating factors as an IC design signoff level, wherein:

the assigning the statistical distribution of voltage drop values to each path of the plurality of paths comprises using a Monte-Carlo simulation to generate a derating factor histogram, and the defining the path derating factor of the plurality of path derating factors as the IC design signoff level comprises selecting a derating factor of the derating factor histogram.

10. The method of claim 9, wherein a path of the plurality of paths comprises a data launch path and a data capture path, the corresponding transition sequence comprises a time variable between a data launch path transition time and a data capture path transition time, and the corresponding timing gap has a value based on a difference between time variables of the corresponding first and second timings.

11. The method of claim 10, wherein the calculating the corresponding path derating factor of the plurality of path derating factors comprises setting a product of the path derating factor and the data launch path transition time equal to a difference between the data launch path transition time and the timing gap.

12. The method of claim 9, wherein the assigning the statistical distribution of the voltage drop values to each path of the plurality of paths comprises one or more of basing one or more voltage drop values on a cell feature, applying user-defined activity factors to the statistical distribution, or applying a user-defined probability profile to the statistical distribution.

13. The method of claim 9, wherein the selecting the derating factor of the derating factor histogram comprises selecting one of an average derating factor or a greatest derating factor.

14. The method of claim 9, wherein the IC design signoff voltage comprises a slow corner voltage.

15. An integrated circuit (IC) design system comprising:

a processor; and a non-transitory, computer readable storage medium including computer program code for one or more programs, the non-transitory, computer readable storage medium and the computer program code being configured to, with the processor, cause the processor to:

determine a first timing of a transition sequence of a signal on a path of an IC design, the first timing being based on an IC design signoff voltage;

determine a second timing of the transition sequence of the signal on the path, the second timing being based on the IC design signoff voltage and a first voltage drop of a plurality of voltage drops along the path, the second timing of the transition sequence is one second timing of a plurality of second timings of the transition sequence corresponding to the plurality of voltage drops;

calculate a plurality of path derating factors based on corresponding timing gaps between second timings of the plurality of second timings and the first timing of the transition sequence; and perform a timing analysis on the IC design based on the plurality of path derating factors.

16. The IC design system of claim 15, wherein the path comprises a data launch path and a data capture path, and the computer readable storage medium and the computer program code are configured to, with the processor, cause the processor to:

calculate the timing gaps based on comparisons of a first difference between a data launch path transition and a data capture transition of the first timing of the transition sequence to respective second differences between the data launch path transition and the data capture transition of corresponding second timings of the plurality of second timings of the transition sequence.

17. The IC design system of claim 16, wherein the computer readable storage medium and the computer program code are configured to, with the processor, cause the processor to:

calculate the plurality of path derating factors by setting products of the plurality of path derating factors and a time of the data launch path transition equal to respective differences between the time of the data launch path transition and the corresponding timing gaps.

18. The IC design system of claim 15, wherein the computer readable storage medium and the computer program code are configured to, with the processor, cause the processor to:

assign a statistical distribution of values to the plurality of voltage drops of the second timings of the plurality of second timings by applying at least one of user-defined activity factors or a user-defined probability profile to the statistical distribution.

19. The IC design system of claim 15, wherein the computer readable storage medium and the computer program code are configured to, with the processor, cause the processor to:

assign a statistical distribution of values to the plurality of voltage drops of the second timings of the plurality of second timings by using a Monte-Carlo simulation to generate a derating factor histogram, receive a user selection of a derating factor of the derating factor histogram as an IC design signoff level, and perform the timing analysis on the IC design based on the IC design signoff level.

20. The IC design system of claim 15, wherein:

the path is a first path of a plurality of paths of the IC design, the plurality of voltage drops along the path is included in a plurality of voltage drops of the IC design, and the computer readable storage medium and the computer program code are configured to, with the processor, cause the processor to assign a statistical distribution of values to the plurality of voltage drops of the IC design.

* * * * *